United States Patent [19]

Schweitzer, Jr.

[11] Patent Number: 5,077,520

[45] Date of Patent: Dec. 31, 1991

[54] HIGH IMPEDANCE VOLTAGE INDICATOR HAVING CAPACITIVE VOLTAGE DIVIDER

[76] Inventor: Edmund O. Schweitzer, Jr., 2433 Center St., Northbrook, Ill. 60062

[21] Appl. No.: 576,162

[22] Filed: Aug. 30, 1990

Related U.S. Application Data

[63] Continuation of Ser. No. 523,703, May 15, 1990, abandoned.

[51] Int. Cl.$^5$ .................. G01R 19/155; G02F 1/13
[52] U.S. Cl. .................. 324/133; 324/126; 359/84
[58] Field of Search .................. 324/96, 133, 509, 127, 324/115, 126, 72, 72.5; 350/331 R, 332, 336; 340/753, 784

[56] References Cited

U.S. PATENT DOCUMENTS

| | | | |
|---|---|---|---|
| 3,614,610 | 10/1971 | Legatti | 324/115 |
| 3,660,757 | 5/1972 | Winslow | 324/122 |
| 3,667,039 | 5/1972 | Garfein et al. | 324/92 |
| 3,774,195 | 11/1973 | Schulthess et al. | 340/324 |
| 4,035,060 | 7/1977 | Tsunoda et al. | 350/332 X |
| 4,139,820 | 2/1979 | Rode | 324/133 |
| 4,152,639 | 5/1979 | Chaffee | 324/51 |
| 4,251,770 | 2/1981 | Schweitzer, Jr. | 324/133 |
| 4,259,634 | 3/1981 | Okamoto et al. | 324/74 |
| 4,301,407 | 11/1981 | Koslar | 324/96 |
| 4,503,389 | 3/1985 | Singer | 324/133 |
| 4,559,496 | 12/1985 | Harnden, Jr. et al. | 324/127 |
| 4,823,078 | 4/1989 | Mohebban | 324/133 |

FOREIGN PATENT DOCUMENTS

| | | |
|---|---|---|
| 1011161 | 12/1948 | France . |
| 1199016 | 7/1970 | United Kingdom . |

OTHER PUBLICATIONS

"Liquid Crystal Display", A publication of Hamlin Inc., Lake and Grove Streets, Lake Mills, Wis., circa Jun. 1, 1989.

"Electronically Scanned Analog Liquid Crystal Displays", by R. A. Soref, *Applied Optics*, Jun. 1970, vol. 9, No. 6.

*Primary Examiner*—Jack B. Harvey
*Attorney, Agent, or Firm*—Lockwood, Alex, FitzGibbon & Cummings

[57] ABSTRACT

A voltage indicator for instantaneously indicating the voltage level on an electrical conductor within a connector component in an AC power distribution system includes a housing for engaging the body of the connector component. Within the housing, the display electrodes of a multi-segment high impedance liquid crystal display component are coupled to the monitored conductor through a capacitive voltage divider to provide an unambiguous bar graph type indication of the voltage level on the conductor.

11 Claims, 5 Drawing Sheets

U.S. Patent Dec. 31, 1991 Sheet 1 of 5 5,077,520
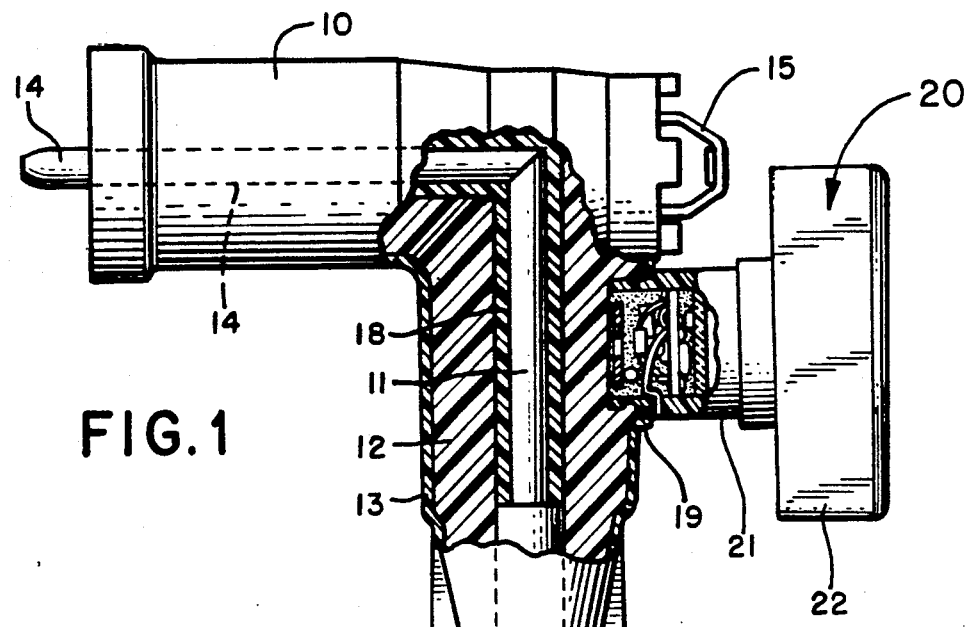
FIG.1
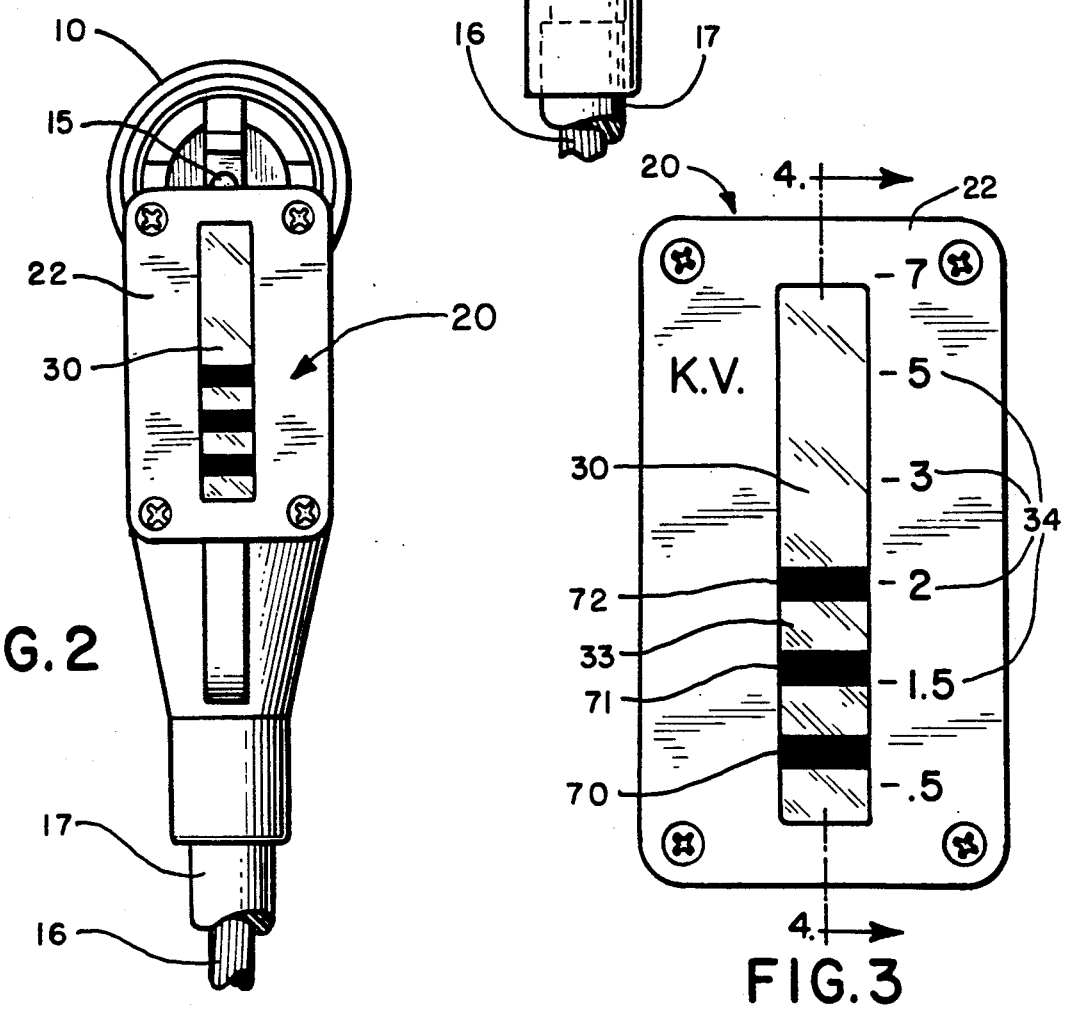
FIG.2
FIG.3

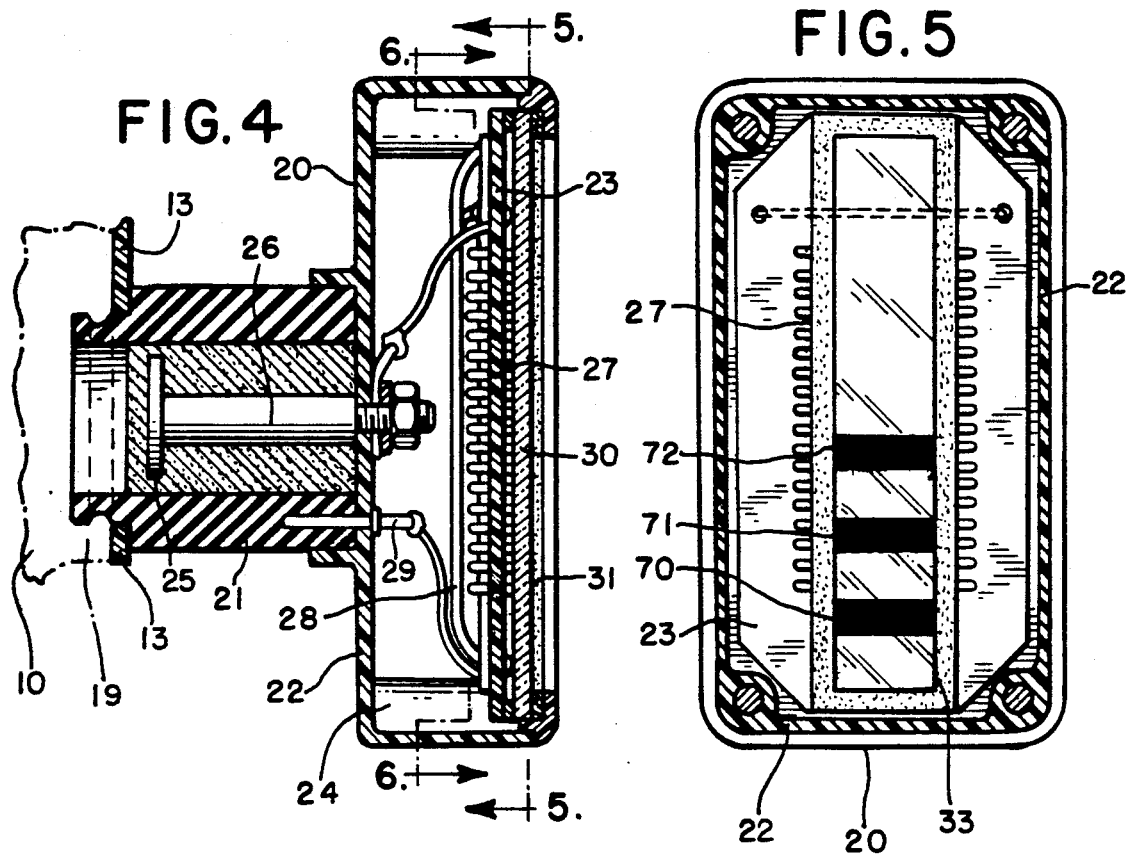
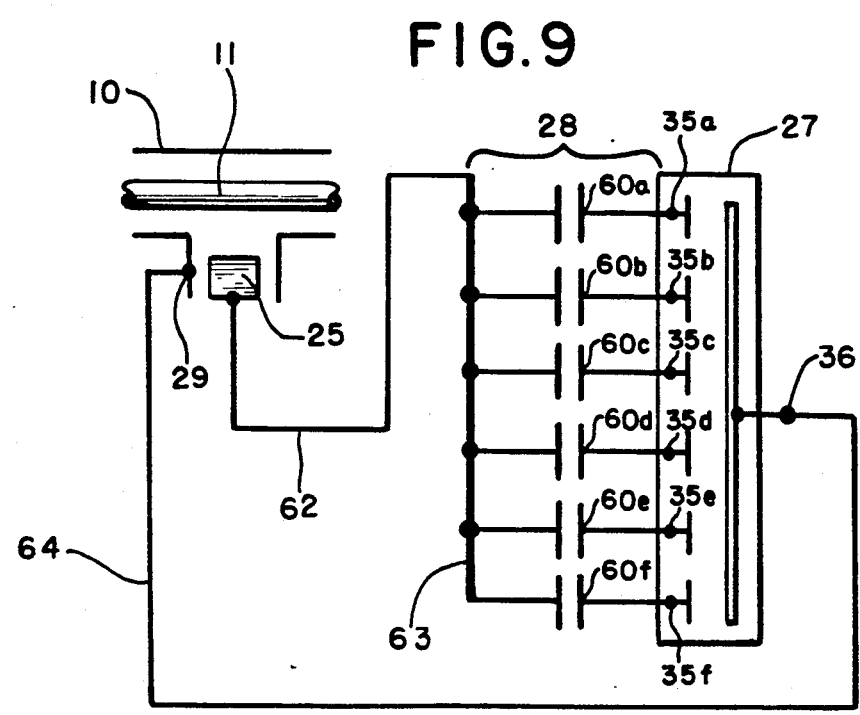

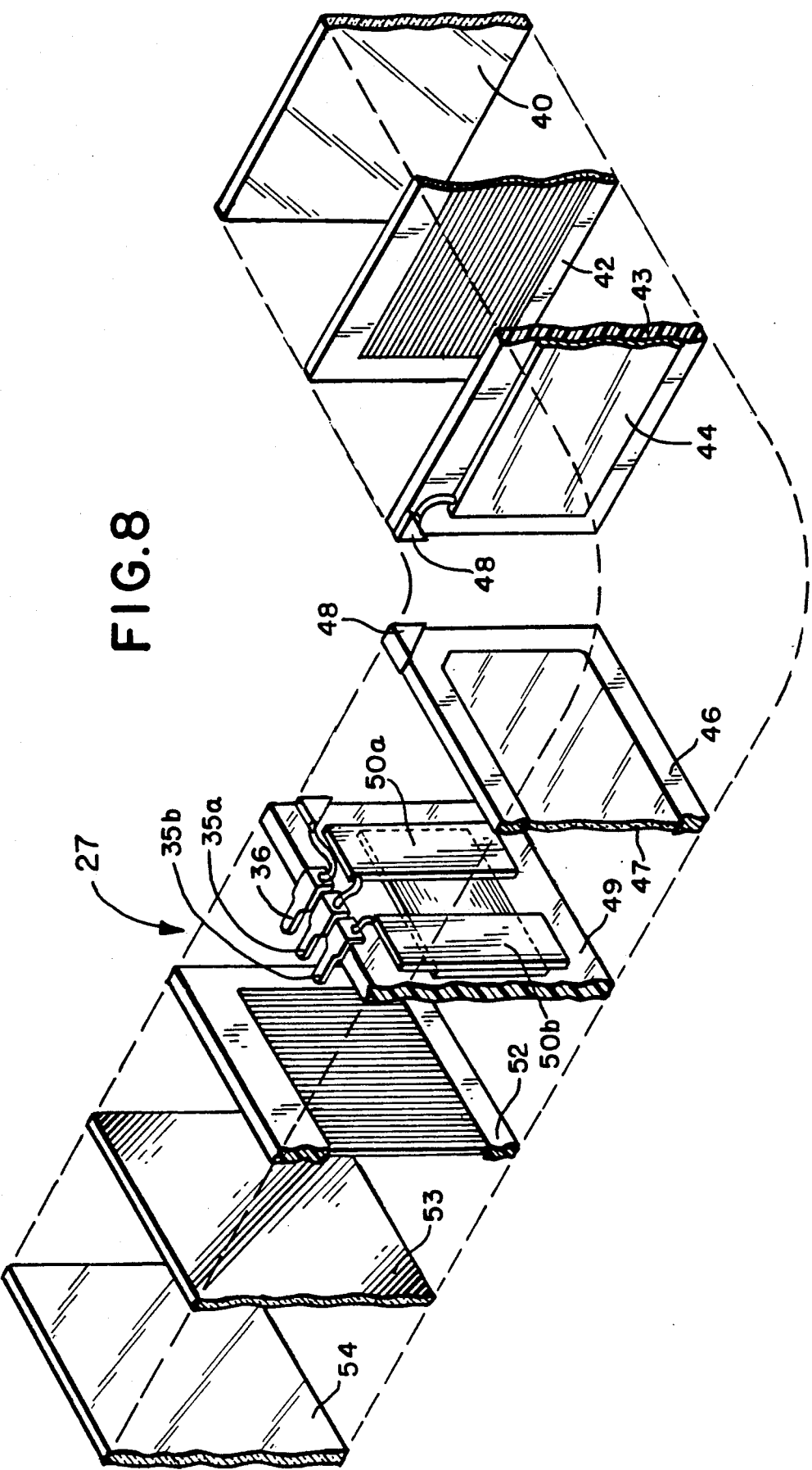

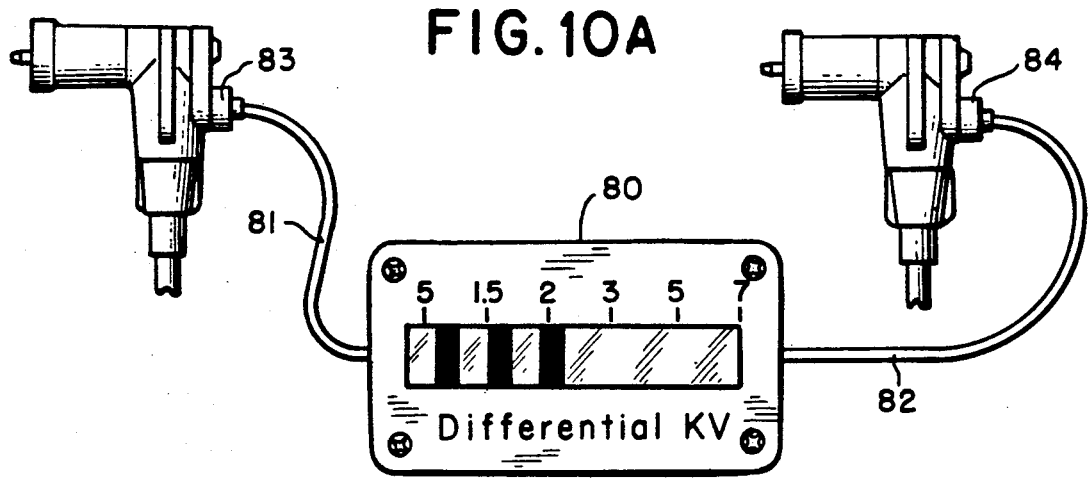
FIG. 10A
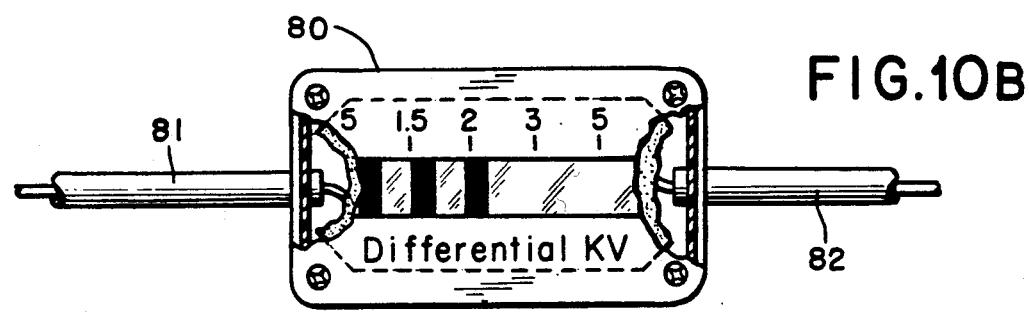
FIG. 10B
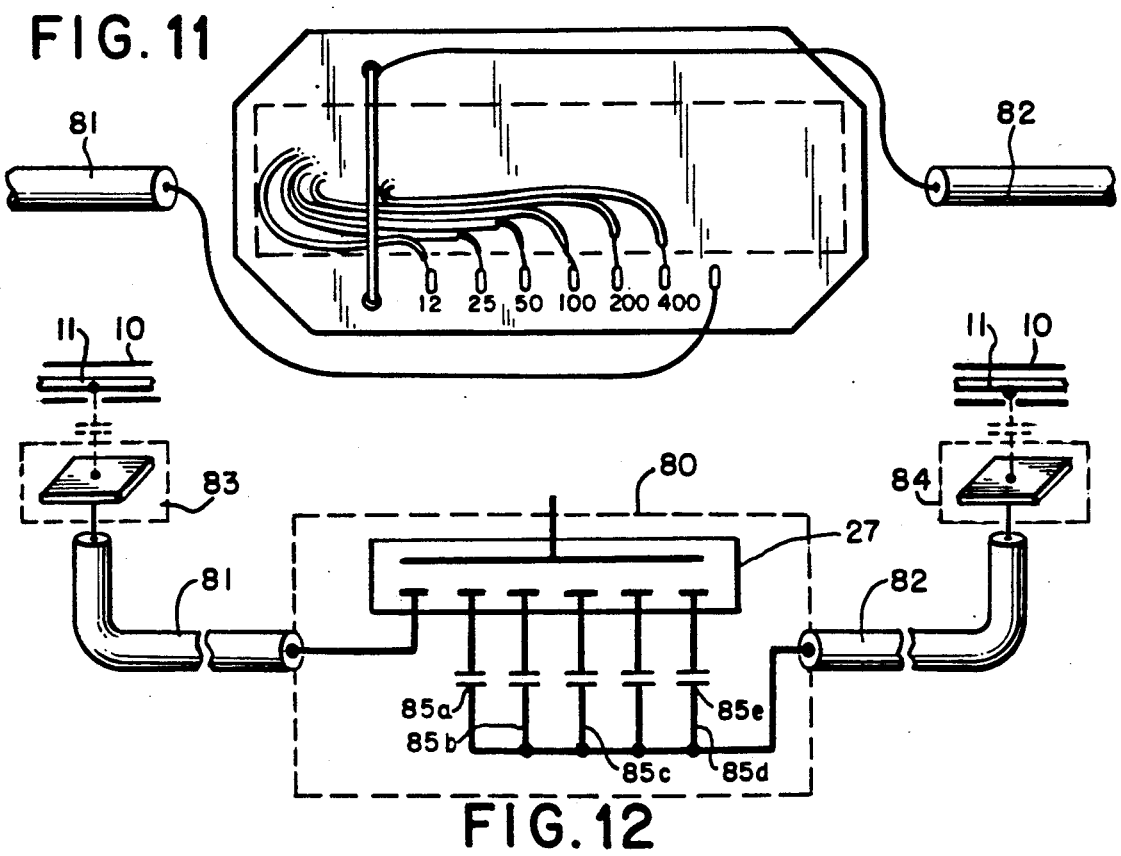
FIG. 11
FIG. 12

HIGH IMPEDANCE VOLTAGE INDICATOR HAVING CAPACITIVE VOLTAGE DIVIDER

This application is a continuation of application Ser. No. 523,703, filed May 15, 1990, now abandoned.

BACKGROUND OF THE INVENTION

The present invention is directed generally to circuit monitoring devices, and more particularly, to an improved high impedance voltage indicator.

Various devices have been developed for indicating the voltage level on electrical conductors in high voltage power distribution systems.

One such early device was an electroscope wherein a pivoted vane was arranged to be repelled from a fixed vane on contact with an energized line. This device had to be positioned very precisely since the force of electrostatic repulsion of the vanes was relatively small and opposed by gravity. Another early device utilized an electromechanical meter movement in conjunction with a high resistance series resistor to ground. This device was cumbersome, and could not detect small charges and at high voltages required a high potential impedance return path to ground.

The present invention overcomes these drawbacks by providing a voltage indicator which incorporates a high impedance non-mechanical visual display device in the form of a liquid crystal display. This results in an indicator of increased sensitivity which is more compact and easier to manufacture, and which provides a large non-ambiguous indication of voltage level to the user.

Accordingly, it is a general object of the present invention to provide a new and improved voltage indicator.

It is a more specific object of the present invention to provide a voltage indicator which avoids the use of electromechanical indicator mechanisms and batteries.

It is a still more specific object of the invention to provide a voltage indicator which is more compact and less costly to manufacture.

SUMMARY OF THE INVENTION

The invention is directed to a voltage indicator for indicating the voltage level on a monitored electrical conductor. The indicator includes a housing adapted for mounting in a fixed position relative to the monitored conductor, voltage indicating means within the housing comprising a plurality of high impedance display devices each having at least one pair of display electrodes disposed in operative association with a layer of voltage-responsive light controlling material, and each providing on the exterior of the housing a first display condition in the absence of an actuating signal exceeding a pre-determined voltage level applied to the display electrodes, and a second display condition in the presence of an actuating signal exceeding the predetermined voltage level applied to the display electrodes, and circuit means comprising a voltage divider for applying progressively increasing portions of the voltage on the monitored conductor to respective ones of the display electrodes of the display devices to actuate the display devices to the second display condition in a predetermined sequence with increasing voltage on the monitored conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 a side elevational view partially in section of a voltage indicator constructed in accordance with the invention shown installed on the test point terminal of an elbow terminator.

FIG. 2 is a front elevational view of the installed voltage indicator of FIG. 1.

FIG. 3 is a front elevational view showing the indicator window of the voltage indicator of FIGS. 1 and 2.

FIG. 4 is an enlarged cross-sectional view of the voltage indicator taken along line 4—4 of FIG. 3.

FIG. 5 is a cross-sectional view of the voltage indicator taken along line 5—5 of FIG. 4.

FIG. 8 is an enlarged exploded perspective view showing the principal elements of the liquid crystal display component utilized in the voltage indicator of FIGS. 1-7.

FIG. 9 is an electrical schematic diagram of the voltage indicator of FIGS. 1-8.

FIGS. 10A and 10B are front views of alternate constructions of the voltage indicator for providing a differential voltage indication.

FIG. 11 is an interior cross-sectional view of the differential voltage indicator of FIGS. 10A and 10B showing principal electrical components thereof.

FIG. 12 is an electrical schematic diagram of the differential voltage indicator of FIGS. 10-11.

DESCRIPTION OF THE PREFERRED EMBODIMENT

Figure 6:
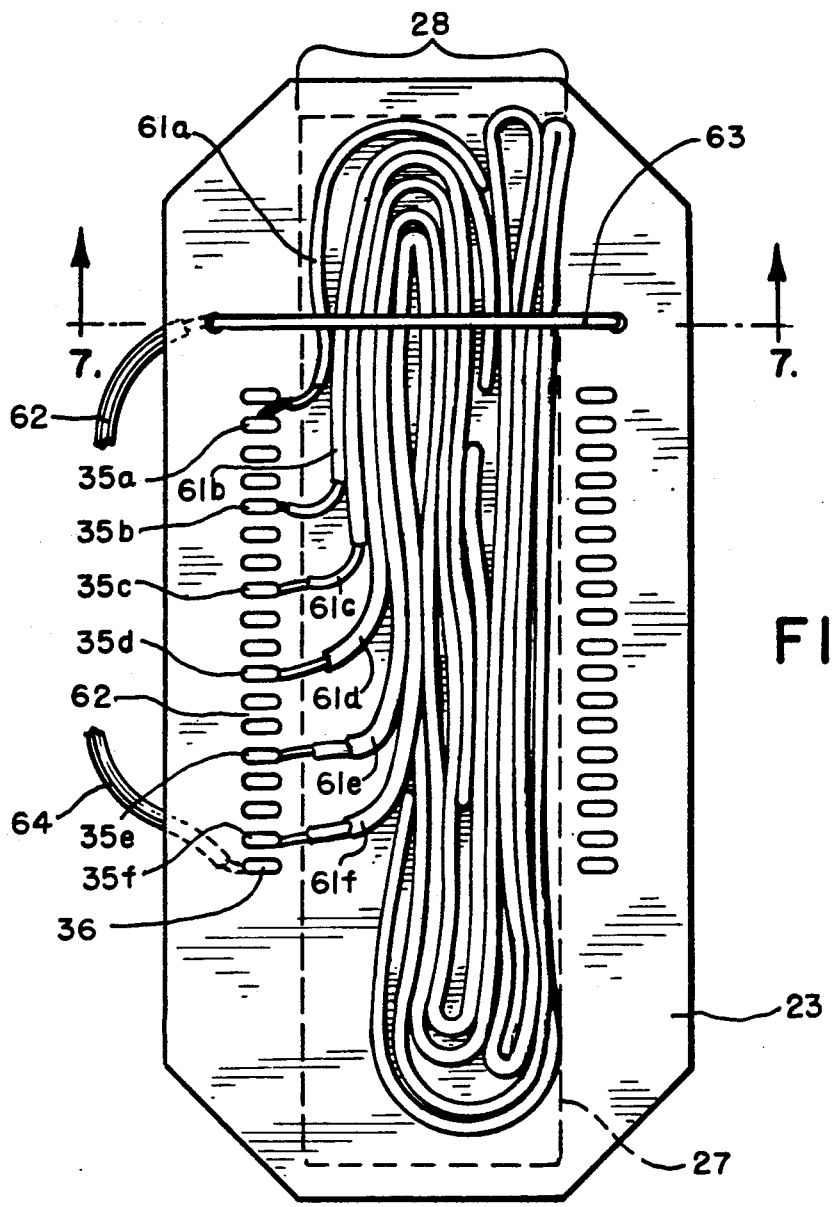
FIG. 6 is an enlarged cross-sectional view of the voltage indicator taken along line 6—6 of FIG. 5.

Referring to the drawings, and particularly to FIGS. 1-8, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact on the associated system component. An arcuate member 15 having ends anchored in the conductive sheath 13 extends from the connector to receive the hooked end of a lineman's tool (not shown). The axial conductor 11 is connected, in accordance with conventional practice, to the conductor 16 of a flexible cable 17 of the type commonly utilized in power distribution systems. A layer 18 of semi-conductive material may be provided around conductor 11 to provide stress relief for the electric field within the connector in a manner well known to the art.

To provide for detecting fault currents or measuring voltage levels in conductor 11 connector 10 includes a test point socket 19 for receiving a circuit monitoring component, in this instance a voltage indicator 20. The test point socket 19, which is preferably constructed as described in U.S. Pat. No. 4,904,932 of the present applicant, is formed within the insulating body portion of the connector, extending through the electrically-conductive outer sheath 13. In particular, this socket is preferably cylindrical in form and of an axial extent such that the test point socket 19 receives a portion of the fault indicator housing.

The voltage indicator 20 is seen in FIGS. 3-5 to include a stem portion 21 formed of an electrically conductive rubber or similar semi-resilient material, and a generally rectangular body portion 22 formed of a non-electrically conductive impact resistant plastic or epoxy material within which the principal electrical components of the fault indicator are contained. In particular, within housing portion 22 the fault indicator module includes a rectangular insulator board 23 (FIGS. 4 and 5) positioned perpendicularly to the axis of the housing at a location intermediate the ends thereof, and a portion 24 (FIG. 4) of high electrical resistance potting compound at the inside end of the housing for securing the insulator board in place. Additional electrical components contained in housing 22 include a capacitive coupling element in the form of a metallic plate 25 for capacitively coupling the circuitry of the fault indicator to conductor 11, an electrically conductive stem 26 for securing plate 25, a high impedance electronic display component 27 for visually indicating voltage level, and an arrangement 28 of coaxial wire segments comprising a voltage divider for applying predetermined portions of the voltage sensed on conductor 11 to display device 27.

Operating power for the circuitry of voltage indicator module 20 is derived from conductor 11 by means of the metallic plate 25, which when indicator 20 is seated in test point socket 19 is sufficiently closely spaced to the conductor to provide a level of capacitive coupling whereby an adequate alternating voltage is derived from the conductor. A necessary ground return for this circuitry may be provided, as shown in FIGS. 1-5, by an electrical ground terminal 29 which is imbedded in housing portion 21. When housing portion 21 is seated in test point socket 19 of connector 10 conductor 29 is brought into electrical communication with the electrically grounded sheath 13 of the connector.

As shown in FIGS. 3-5, within housing portion 22 the liquid crystal display component 27 is positioned against a transparent window 30 such that the indicator face of the component is readily viewable from the exterior of the housing. A mask 31 (FIG. 4) formed of a thin sheet of opaque material may be provided on the inside surface of window 30 s that only the indicator face can be seen.

As shown in FIG. 3, the liquid crystal display component 27 is capable of producing a vertical bar display 33 to indicate the voltage level in conductor 11. Indicia 34 on housing portion 22 beside window 30 assist the user in quantifying the displayed level in volts or other units of measure.

In the illustrated embodiment, where the bar graph display is composed of six display elements, electrical connections are made to display component 27 by means of six electrically conductive terminals 35a-35f (FIG. 6) arranged along the top edge of the component.

Internally, as shown in FIG. 8, the liquid crystal display component 27 generally includes a transparent face plate 40, a front polarizer 42, a glass plate 43 on which a transparent backplane electrode 44 is provided, a perimeter seal 46 containing a layer 47 of twisted nematic liquid crystal material, electrically conductive edge contacts 48, a glass plate 49 on which six transparent indicator segment electrodes 50a-50f (plates 50c-50f not shown) are contained, a rear polarizer 52 aligned at right angles to front polarizer 42, a reflector 53 and a rear support plate 54.

Display component 27 may be conventional in construction and operation. The individual bar displays are formed by the nematic liquid crystal layer 47, which in the absence of an applied electric field has the property of rotating the polarization of light as it passes through the molecular layers of the layer. In particular, as randomly polarized light enters the display component through face plate 40, only vertically polarized light passes through front polarizer 42. In the absence of an applied electric field, the polarization of this polarized light is rotated 90° as it passes through the nematic liquid crystal layer 47 and reaches rear polarizer 50. Since the polarization of the light has been rotated the light is able to pass through this polarizer onto the reflective layer 51, wherein it is reflected back through polarizer 50, rotated by liquid crystal layer 47 and passed through polarizer 42 to front plate 40 and window 30. Thus, in the absence of an applied electric field light entering face plate 40 is passed through the device and reflected back out, presenting a blank or white colored appearance to the observer.

By applying an electric field between one or more indicator segment electrodes 50a-50f and their associated backplane electrode 44 the liquid crystal layer in its intervening portions is caused to pass incoming light without rotating its polarization, thereby selectively blocking the transmission and reflection of light to the viewing window 30 in the bar graph pattern and causing this to be displayed to a viewer as darkened bars.

An electric field is established to generate the bar display by applying a signal to the appropriate ones of contacts 35a-35f and 36, which connect to respective ones of display electrodes 35a-35f and backplane 44.

Referring to FIG. 9, the necessary signals for actuating the bar displays are provided by a circuit within housing portion 22. In particular, the circuit includes six capacitors 60a-60f which, connected between terminals 35a-35f and display electrodes 50a-50f, respectively, form a voltage divider network which applies a progressively increasing portion of the voltage sensed by plate 25 to the respective electrodes.

In the preferred construction shown in FIG. 6, the six voltage divider capacitors 60a-60f are formed by six coaxial wire segments 61a-61f of progressively increasing length. A conductor 62 establishes a direct electrical connection between the voltage sensing plate 25 and a bare wire segment 63, which overlies and connects with the outer conductive layer of the six wire segments. A ground return for display component 27 is established by a conductor 64, extending from backplate terminal 36 to ground terminal 29.

Figure 7:
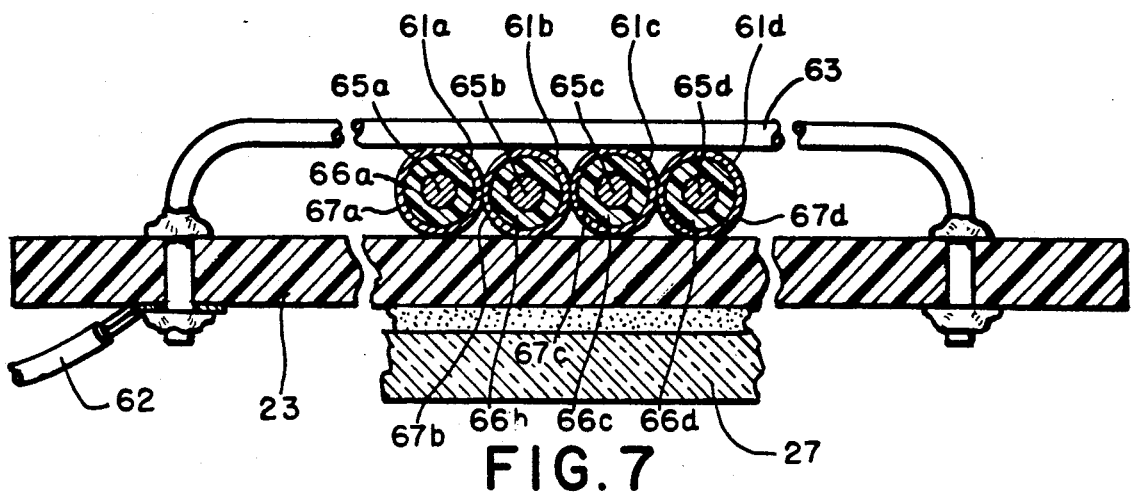
FIG. 7 is an enlarged cross-sectional view of a portion of the voltage indicator taken along line 7—7 of FIG. 6.

As shown in FIG. 7, capacitors 60a-60f are coaxial in form, being formed by coaxial wire segments 61a-61f of predetermined lengths. The inner conductors 65a-65f may be formed of a small diameter wire, typically No. 22 or smaller, covered by a concentric layer 66a-66f of electrical insulation, typically 0.005 inches thick. The outer conductors are formed by thin layers 67a-67f of an ohmic material, such as electrically conductive paint, typically applied over the surface of respective ones of insulating layers 66a-66f. In this regard it is necessary, as shown in FIG. 6, that the outer layer not extend to the end of the insulating layer to avoid electrical contact between the outer and inner conductors.

The lengths of the individual coaxial wire segments is varied to very the capacitance provided by the capacitor, and hence the portion of the sensed AC voltage signal on coupling plate 25 applied to the associated display device. The wire segments can then be advantageously arranged in a plane as shown, and electrical contact made to all of the outer conductors 67a-67f by a single bare wire segment 63 as shown in FIGS. 6 and 7.

The display devices may be selected bar displays within an LCD display component having multiple bar devices arranged side-by-side in a single component. Depending on the voltage range over which the indicator operates and the desired resolution, selected ones of the bar displays are connected to the capacitve voltage divider circuit.

Specifically, in the illustrated embodiment, six bar displays of eighteen available displays are utilized to display voltage levels of 0.5, 1.5, 2.0, 3.0, 5.0 and 7.0 kilovolts. The length of wire segment 61f, and hence the capacitance of capacitor 50f, is selected such that when the AC voltage level on conductor 11 exceeds 0.5 kilovolts the voltage at terminal 35f exceeds the threshold voltage of the display device and a bar 70 appears at the 0.5 kilovolt index, as shown in FIG. 3. Similarly, when the voltage on conductor 11 reach 2.0 kilovolts, capacitor 60e and 60d apply a voltage in excess of the threshold to terminals 35e and 35d, causing bars 71 and 72 to appear in window 30 in addition to bar 70.

While the voltage indicator has been shown as a testpoint mounted device for monitoring voltage on a conductor, it can also be configured as a differential voltage indicator 80 as shown in FIGS. 10-12. In this application, housing portion 21 is eliminated and connections are made by respective flexible insulated cables 81 and 82 to respective coupling circuits associated with two voltage sources to be compared. Preferably, where coupling by means of elbow terminators the coupling circuits may take the form of snap-on modules 83 and 84 similar to housing portion 21 of voltage indicator 10.

As shown in FIGS. 11 and 12, in the differential embodiment the backplane of the display component 27 is preferably not connected directly to one of the two voltage sources. Instead, an unused display segment electrode is connected to the voltage source to provide an improved impedance match between the two sensing inputs to the device. Individual capacitors 85a-85e provide for a stepped voltage division to the display elements.

While the use of other types of high impedance voltage-actuated light controlling devices is possible, liquid crystal display (LCD) components, because of their extremely high input impedance, are particularly well adapted to the invention. The high input impedance of these devices, typically in excess of $10 \times 10^{15}$ ohms, results in a very low current drain from the display capacitor.

Furthermore, depending on the particular liquid crystal material used, LCD components exibit a well defined threshold voltage over a wide range of ambient temperatures below which the display does not respond to an applied signal. In one successful embodiment of the invention using a Type 7 twisted nematic field effect LCD manufactured by Hamlin, Inc. of Lake Mills, Wis., U.S.A., this threshold is 2.0 volts, which is sufficiently high to prevent the display from falsely responding to residual voltages, but not so high as to require an undesirably large charge on the display capacitor.

Unlike prior voltage indicators, the fault indicator of the invention provides an unambiguous indication of circuit voltage, without the use of electromechanical indicating mechanisms or battery powered instruments, in a more compact and efficient construction.

While particular embodiments of the invention have been shown and described, it will be obvious to those skilled in the art that changes and modifications may be made therein without departing from the invention in its broader aspects, and therefore, the aim in the appended claims is to cover all such changes and modifications as fall within the true spirit and scope of the invention.

I claim:

1. A voltage indicator for indicating the voltage level on a monitored electrical conductor, comprising:
   a housing adapted for mounting in a fixed position relative to the monitored conductor;
   voltage indicating means within said housing comprising a plurality of high impedance display devices each having at least one pair of display electrodes disposed in operative association with a layer of voltage-responsive light controlling material, and each providing on the exterior of said housing a first display condition in the absence of an actuating signal of a predetermined voltage level applied to said display electrodes, and a second display condition in the presence of an actuating signal equal to or greater than said predetermined voltage level applied to said display electrodes; and
   circuit means comprising a capacitive voltage divider including a voltage sensing electrode capacitively coupled to the monitor conductor, and a plurality of capacitors each connected between said sensing electrode and one display electrode of a respective one of said display devices, each of said capacitors comprising a coaxial wire segment, the center conductor of said segment comprising one terminal of said capacitor and the outer conductor of said segment providing the other terminal of said capacitor, for applying progressively increasing portions of the voltage on the monitored conductor to respective ones of said display electrodes of said display devices to actuate said display devices to said second display condition in a predetermined sequence with increasing voltage on the monitored conductor.

2. A voltage indicator as defined in claim 1 wherein said center conductor is formed by a wire segment having a coaxial insulating layer, and said outer conductor is formed by an electrically conductive layer of ohmic material disposed over said insulating layer.

3. A voltage indicator as defined in claim 2 wherein said electrically conductive layers of said capacitors are connected through a common wire connection to said voltage sensing electrode.

4. A voltage indicator as defined in claim 1 wherein said coaxial wire segments are of progressively increasing strength.

5. A voltage indicator as defined in claim 1 wherein said connector body includes an electrically conductive outer sheath, and the other display electrodes of said display device are connected to said sheath.

6. A voltage indicator as defined in claim 5 wherein said other display electrodes of said display devices comprise a common backplane electrode.

7. A voltage indicator for indicating the voltage level on a monitored electrical conductor, comprising:
   a housing adapted for mounting in a fixed position relative to the monitored conductor;
   a voltage sensing electrode capacitively coupled to the monitored conductor;
   voltage indicating means within said housing comprising a plurality of high impedance display devices each having at least one pair of display electrodes disposed in operative association with a layer of voltage-responsive light controlling material, and each providing on the exterior of said housing a first display condition in the absence of an actuating signal of a predetermined voltage level applied to said display electrodes, and a second display condition in the presence of an actuating signal equal to or greater than said predetermined voltage level signal applied to said display electrodes, said display devices being arranged in a predetermined sequence in said housing and viewable from the exterior thereof; and
   circuit means comprising a plurality of capacitors connected between said voltage sensing electrode and one electrode of respective ones of said display devices in said predetermined sequence, each of said capacitors comprising a coaxial wire segment, the center conductor of said segment comprising one terminal of said capacitor and the outer conductor of said segment providing the other terminal of said capacitor, and being of progressively increasing portion of the voltage on said sensing electrode to said display devices in said sequence whereby said display devices indicate the voltage level on the monitored conductor.

8. A voltage indicator as defined in claim 7 including a ground electrode, and wherein said other electrodes of said display devices comprise backplane electrodes, and said backplane electrodes are electrically coupled to said ground electrode.

9. A voltage indicator as defined in claim 7 wherein said center conductor is formed by a wire segment having a coaxial insulating layer, and said outer conductor is formed by an electrically conductive layer of ohmic material disposed over said insulating layer.

10. A voltage indicator as defined in claim 9 wherein said electrically conductive layers of said capacitors are connected through a common wire connection to said voltage sensing electrode.

11. A voltage indicator as defined in claim 7 wherein said coaxial wire segments are of progressively increasing length.

* * * * *